United States Patent [19]
Jansen et al.

[11] Patent Number: 5,276,700
[45] Date of Patent: Jan. 4, 1994

[54] 2-D MONOLITHIC COHERENT SEMICONDUCTOR LASER ARRAY

[75] Inventors: Michael Jansen, Los Angeles; Dan Botez, Redondo Beach; Luke J. Mawst, Torrance; Thomas J. Roth, Redondo Beach; Jane J. Yang, Los Angeles, all of Calif.

[73] Assignee: TRW Inc., Redondo Beach, Calif.

[21] Appl. No.: 849,911

[22] Filed: Mar. 12, 1992

[51] Int. Cl.$^5$ ................................. H01S 3/19
[52] U.S. Cl. .......................... 372/50; 372/45; 372/46; 372/48; 372/23; 372/97
[58] Field of Search .......... 372/50, 45, 23, 97, 372/103, 43, 44, 48, 46

[56] References Cited

U.S. PATENT DOCUMENTS

| | | | |
|---|---|---|---|
| 4,860,298 | 8/1989 | Botez et al. | 372/45 |
| 5,063,570 | 11/1991 | Botez et al. | 372/50 |
| 5,101,413 | 3/1992 | Botez | 372/50 |

OTHER PUBLICATIONS

Botez, et al., *Phase-Locked Arrays of Antiguides: Modal Content and Discrimination*, "IEEE Journal of Quantum Electronics", vol. 26, No. 3, Mar. 1990, pp. 482-495.

Mawst, et al., *High-Power, Narrow-Lobe Operation from 20-Element Phase-Locked Arrays of Antiguides*, "Appl. Phys. Lett . . . ", 55(20), 13 Nov. 1989, pp. 2060-2062.

Primary Examiner—Georgia Y. Epps
Attorney, Agent, or Firm—Sol L. Goldstein

[57] ABSTRACT

This invention discloses a semiconductor laser incorporating a plurality of resonant optical waveguide array cells. In each of the resonant optical waveguide array cells, leaky waveguide elements are coupled together such that radiation leaked from one antiguide element is coupled with radiation propagating along another antiguide element across an interelement region. As the radiation propagates through the array it is reflected at each end of the array until it builds up enough optical gain to reach lasing threshold. Then, radiation is leaked from the sides of each array such that this radiation can impinge other resonant optical waveguide arrays and be coupled with these arrays in phase to develop a laser beam having a higher intensity than can be achieved with a single array semiconductor laser.

27 Claims, 3 Drawing Sheets

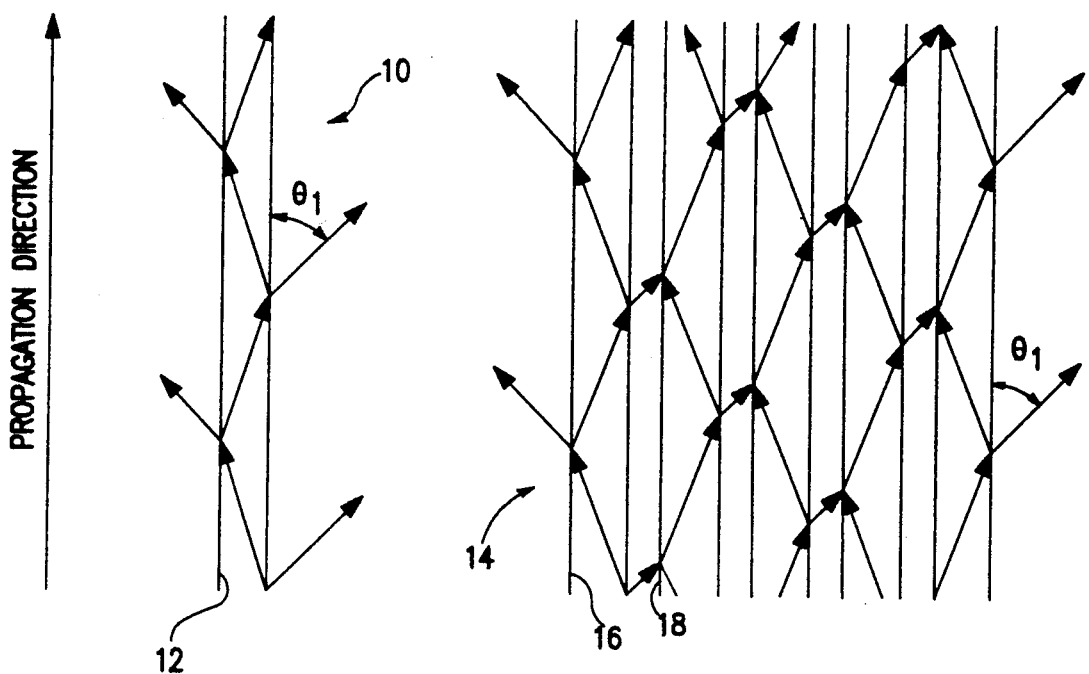
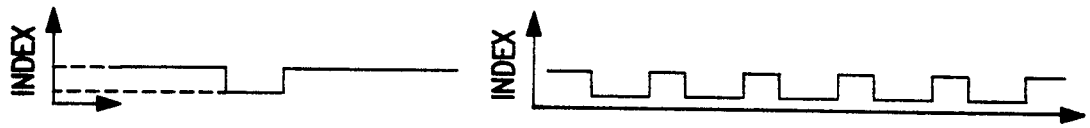
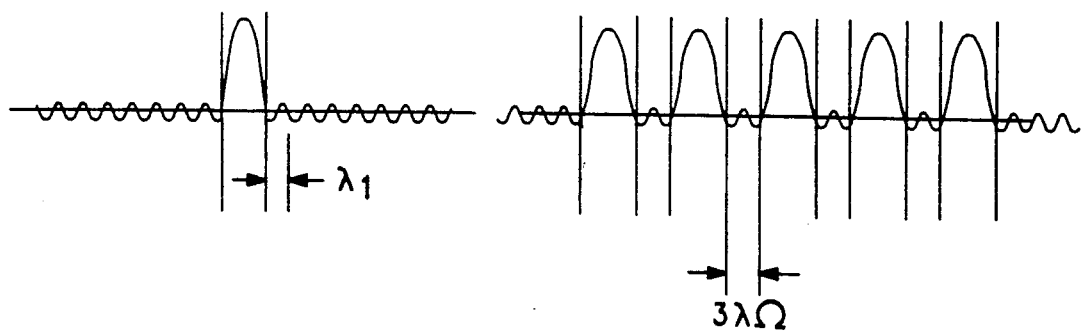
FIG. 1A (PRIOR ART)      FIG. 2A (PRIOR ART)
FIG. 1B (PRIOR ART)      FIG. 2B (PRIOR ART)
FIG. 1C (PRIOR ART)      FIG. 2C (PRIOR ART)

2-D MONOLITHIC COHERENT SEMICONDUCTOR LASER ARRAY

The U.S. Government has a paid-up license in this invention and the right in limited circumstances to require the patent owner to license others on reasonable terms as provided for by the terms of contract No. F29601-91-C-0013 awarded by the Philips Labs, U.S. Air Force.

BACKGROUND OF THE INVENTION

1. Field of the Invention

This invention relates generally to a semiconductor laser, and more particularly, to a semiconductor laser incorporating an array of coherently coupled semiconductor laser array cells on a common substrate.

2. Discussion of the Related Art

Semiconductor lasers are well known in the art. These types of lasers have a number of desirable features including compactness of size, narrow bandwidth, reliability, and a highly directional light beam. It is therefore desirable to utilize semiconductor lasers for a variety of applications including certain medical applications, optical welding, optical storage and signal processing, laser range finding and free-space communications.

By way of background information, the basic operation of a conventional semiconductor laser will be described. As is generally known in the art, a semiconductor laser typically incorporates a multi-layered structure comprised of a number of specially doped semiconductor regions. The composition of the semiconductor material of the different layers is determined to provide a discrimination in the indices of refraction between at least some of the different layers, and thus develop a layer in which light can be confined. Adjacent layers to the confining layer, or active region, are typically referred to as cladding layers. A forward bias current across the confining layer will enable the charge carriers to recombine and emit light at a particular frequency to provide the lasing action. By confining the lasing region of the semiconductor laser to the active region, it is possible to increase the intensity of this generated light. By incorporating mirrors at each end of the active region, waves of light will oscillate back and forth within this region such that the intensity of the wave will increase until the radiation generates enough energy for lasing to occur within the semiconducting material.

Not only must the light be confined in the active region in a vertical direction by means of the layer structure, it must also be confined in the active region in a lateral direction. One known method of confining the light in a lateral direction within a particular active region is generally referred to as positive index guiding. In this type of laser, the refractive index of the material is highest in regions in which the light propagates and lower in regions aligned with the higher index of refraction regions. Another method of confining the light is known as negative-index guiding. In a negative-index guiding or antiguide laser, the refractive index of the semiconductor material is lowest in the regions in which the light propagates and higher in adjacent aligned regions. Consequently, some of the light which is incident on the higher refractive index boundary would leak out of the lasing region.

In a conventional semiconductor laser, propagation of the light is generally limited to a single region or element within the semiconductor. Because of this the power output of the laser is limited. To increase the power output of semiconductor lasers, it is known to fabricate arrays for which the elements are coupled to each other.

One known antiguide semiconductor laser array is the phase-locked, resonant optical waveguide (ROW) which incorporates an array of elements resonantly coupled to each other by leaky waves. See for example, Botez et al., *Phase-Locked Arrays of Antiguides: Modal Content and Discrimination*, "IEEE Journal of Quantum Electronics", Vol. 26, No. 3, Mar. 1990 and Mawst et al., *High-Power, Narrow-Lobe Operation from 20-Element Phase-Locked Arrays of Antiguides*, "Appl. Phys. Lett.," 55 (20), 13 Nov. 1989, both of which are herein incorporated by reference. In these types of ROW lasers, an array cell of aligned channels are fabricated on a common substrate by an appropriate semiconductor deposition process, such as metal organic chemical vapor deposition (MOCVD), to form an alternating array of elements having a first index of refraction adjacent interelements having a higher index of refraction. A portion of the laser radiation propagating in an active region within each of the elements will be leaked into the interelements at each reflection off the walls of the elements at the transition of low to high indices of refraction. The laser radiation which is leaked out of one element, crosses the adjoining interelement and enters an adjacent element, and is coherently coupled to the radiation traveling in that element depending on the distance between the adjacent elements, thus creating a resonance condition. Since the leaked radiation from one element is coupled with the radiation in the next element, it adds to the intensity of the laser radiation in that element. Once the intensity of the laser radiation reaches a lasing threshold level, and all elements are coupled in phase with each other, light from the semiconductor array is emitted into a narrow beam at an angle substantially perpendicular to the plane of the substrate. A higher number of elements thus results in a higher intensity beam.

For an array cell of laser elements as discussed above, it is possible that the radiation being reflected back and forth oscillates in more than one spatial mode. For an array cell of lasers which operates in several modes, the generated laser beam will have many uncorrelated lobes. The array cell can be thought of as emitting more than one beam for each different mode. The quality of the semiconductor laser, expressed as the Strehl ratio, is reduced due to the increased width of the beam distribution pattern. It is desirable in most applications to produce a semiconductor laser which operates in a single mode. The single fundamental mode preferably should be one in which all of the elements are in phase, called the in-phase mode, to achieve a high Strehl ratio.

Strong coupling of leaked radiation between the elements lends itself to the suppression of other, secondary modes of radiation having a separate phase than the primary or in-phase mode. Mode discrimination is partly realized due to the presence of transverse losses within the interelements. However, as the width of the array increases due to an increase in the number of coupled elements, the more difficult it is to maintain a single mode, and thus, the number of modes may increase above the fundamental mode. In addition, the photolithographic and deposition processes used to fabricate the array also limits the dimensions of each of the elements, and interelements. With the present technology, a semiconductor array cell of this type is limited to about 40 different adjoining array elements having a combined width of about 200 microns. An array cell of a wider dimension generally results in adverse transmission of secondary modes which interfere with the primary in-phase mode of the laser beam. Consequently, the power output of the semiconductor laser is limited by these factors. For a more thorough discussion of modal discrimination in a semiconductor laser array cell of the type discussed above, see Botez et al U.S. Pat. No. 5,063 570, issued Nov. 5, 1991, herein incorporated by reference and assigned to the assignee of the instant application.

What is needed then is a semiconductor laser incorporating multiple arrays of antiguides which has an increased power output over the prior art semiconductor lasers, and whose output is limited to a single mode. It is therefore an object of the present invention to provide appropriate coupling of such semiconductor lasers in a two-dimensional configuration.

SUMMARY OF THE INVENTION

This invention is directed to a surface emitting semiconductor laser incorporating an array of ROW leaky-wave coupled array cells fabricated on a common substrate. Each of the different array cells is comprised of a plurality of antiguide elements and interelements configured in alternating channels. The elements are at one index of refraction and the interelements are at another index of refraction greater than the index of refraction of the elements. By this configuration, the elements act as antiguides due to the fact that a portion of the radiation traveling in the elements will be leaked into the interelements at the reflection points. The elements are spaced from each other by the interelements at a dimension such that light which leaks from the elements traverses an adjacent interelement and is coupled to the propagation of light in the next element. Typically this distance is approximately an odd number of one-half lateral wavelengths of the radiation leaked from each array element.

Each end of each array cell includes a mirror positioned perpendicular to the propagation direction of the radiation such that the radiation is reflected back and forth along the elements until the semiconductor lasing effect generates a threshold level of power to enable self-sustained oscillation. Once this is accomplished the emitted lasing beam is reflected upwards substantially perpendicular to the substrate at a predetermined angle.

In each of the array cells discussed above, the outer array elements at each side of the individual array cells also are leaky such that some radiation is emitted from the sides of the array cell at a predetermined angle relative to the axis defining the elements. By incorporating second and third array cells positioned to receive the radiation leaked from both sides of a first array cell, it is possible to couple the second and third array cells to the first array cell such that the leaked radiation is received by these array cells and radiation is generated in phase with the radiation generated in the first array cell. Likewise, a fourth array cell can be aligned with the first array cell such that radiation leaked from the sides of the second and third array cells which face each other are coupled in the fourth array cell. This diamond shape array of semiconductor laser array cells can be increased up to a number of array cells which the fabrication processes can tolerate and the secondary modes can be suppressed. In addition, electrodes can be deposited on the substrate between the array cells such that any deviation in the phase of the radiation within the coupled array cells can be compensated for by applying an appropriate current to the electrodes. Consequently, the power of the semiconductor laser can be increased according to the number of array cells which are coupled together.

Additional objects, advantages, and features of the present invention will become apparent from the following description and appended claims, taken in conjunction with the accompanying drawings.

BRIEF DESCRIPTION OF THE DRAWINGS

FIGS. 1(a)-1(c) is a wave propagation and index of refraction depiction of a single leaky waveguide (antiguide);

FIGS. 2(a)-2(c) is a wave propagation and index of refraction depiction of an array cell of leaky waveguides (antiguides);

DETAILED DESCRIPTION OF THE PRESENT EMBODIMENTS

Figure 3:
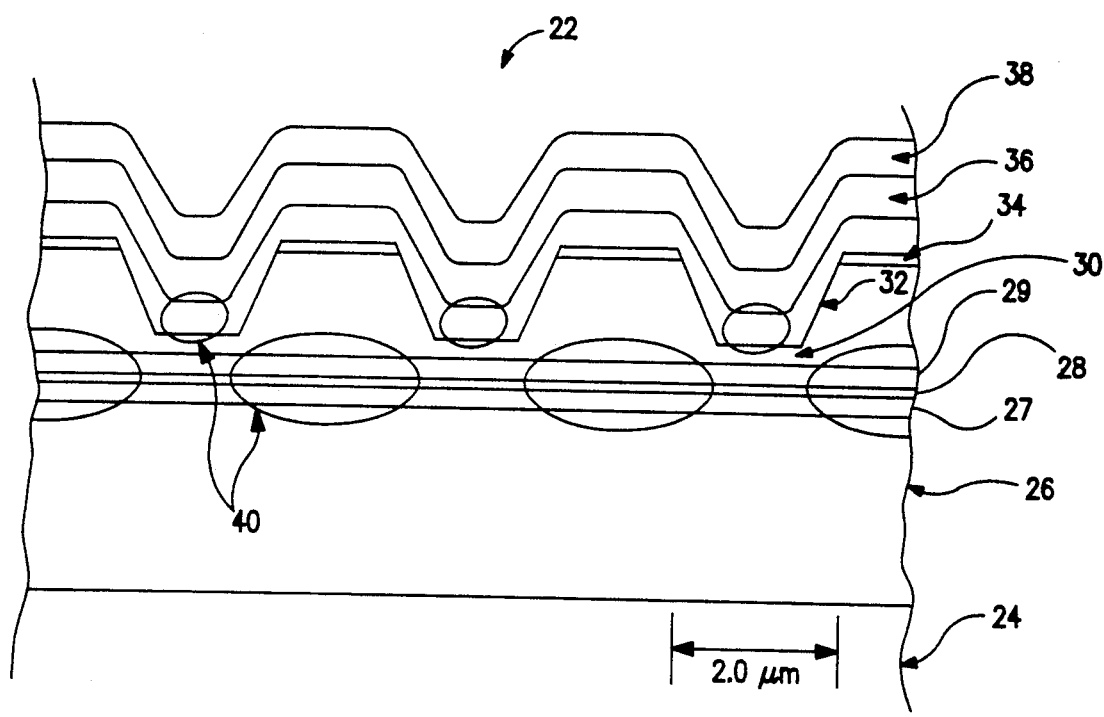
FIG. 3 is a cross section of an ROW semiconductor array cell.

The following description of the preferred embodiments concerning a semiconductor laser incorporating coupled array cells is merely exemplary in nature and is in no way intended to limit the invention or its application or uses.

Since this invention proposes coupling of a plurality of array cells of leaky waveguides, it is desirable to again review the operation of the individual array cells with reference to particular schematics. First turning to FIG. 1, a schematic representation of a single antiguide 10 is shown. As set forth in FIG. 1(a), single antiguide 10 is represented by an element 12 in which a beam of radiation, as shown, travels down the element 12 by reflecting off the inner walls of the element 12. As will be discussed below, antiguide 10 is of a semiconductor material in which the element 12 has an index of refraction which is less than the index of refraction of the adjacent regions on either side of the element 12.

The indices of refraction are represented in FIG. 1(b). In this manner, at each reflection point within the element 12 a percentage of the radiation will be transmitted into the adjacent regions at an angle $\theta_1$ which is set by the angle at which the radiation impinges the inner wall of the element 12, the wavelength of the radiation and the indices of refraction, as is known in the art.

The percentage of the radiation which is emitted into the side regions is shown in FIG. 1(c) as a function of the amplitude of the emitted radiation into these regions. The percentage of the radiation which is not emitted into the higher index of refraction regions is reflected back into the element 12.

Now turning to FIG. 2, an antiguide array cell 14 is depicted in a schematic representation. The array cell 14 is comprised of an alternating configuration of the elements 16 and the interelements 18 as shown in FIG. 2(a). Radiation propagates along the elements 16 as above for the element 12. By setting the spacing between the elements 16 to an odd number of one-half lateral wavelengths of the radiation leaking from the elements 16, it is possible to in-phase couple the radiation leaked from one element 16 into a consecutive element 16 through the interelement 18 between them, as shown. Consequently, the leaked radiation is in phase with the radiation in all of the elements and thus a resonant condition exists.

FIG. 2(b) shows the relative indices of refraction of the elements 16 and the interelements 18. As is apparent, the interelements 18 have a higher index of refraction than the elements 16. Furthermore, FIG. 2(c) shows the amplitude of the intensity of the radiation in the elements 16 and the interelements 18, and the spacing between them. As is apparent, the elements 16 are generally of a wider dimension than the interelements 18.

As mentioned above, the semiconductor antiguide array cells are formed by an appropriate deposition growth process, such as MOCVD, in which the different semiconductor layers are grown to the desired thicknesses and doping concentrations in order to develop the appropriate characteristics for in-phase coupling of the radiation across the interelements. FIG. 2 merely shows a schematic top view of a semiconductor laser array cell 14. For a better understanding of the actual array cell itself, a cross section of a semiconductor laser array cell 22 depicting the different layers is shown in FIG. 3. It is noted that the parameters of the semiconductor array cell 22 of FIG. 3 is intended to be by way of a nonlimiting example.

Semiconductor laser array cell 22 includes a heavily doped n-type gallium arsenide substrate 24. Fabricated on substrate 24 is a first cladding layer 26 comprised of an n-type $Al_{0.60}Ga_{0.40}As$ and deposited to a thickness of approximately 1.5 $\mu$m. Fabricated on top of the cladding layer 26 is a first confinement layer 27. Fabricated on top of the first confinement layer 27 is an active layer 28. The active layer 28 is a single quantum well GaAs layer having a thickness of approximately 100 angstroms. Fabricated on top of the active layer 28 is a second confinement layer 29. The first confinement layer 27 and the second confinement layer 29 are graded index layers which have a composition of $Al_{0.20}Ga_{0.80}As$ at an edge adjacent the active layer 28 and are appropriately graded outwardly away from the active layer 28. The first confinement layer 27, the active layer 28, and the second confinement layer 29 have a total thickness of approximately 0.4 $\mu$m. The active layer 28 is the region which has optical gain while confinement layers 27 and 29 are the layers having a lower index of refraction than the active layer 28 in order to confine the optical radiation. Fabricated on top of the confinement layer 29 is a second cladding layer 30 comprised of a p-doped $Al_{0.60}Ga_{0.40}As$ layer. Deposited on top of the second cladding layer 30 are three additional p-type layers formed in a sandwich structure, including a first layer 32 comprised of $Al_{0.34}Ga_{0.66}As$ having a thickness of approximately 0.3 microns, a second layer 36 comprised of $Al_{0.60}Ga_{0.40}As$ having a thickness of approximately 0.4 $\mu$m, and a third layer 38 comprised of heavily doped GaAs having a thickness of approximately 0.4 $\mu$m.

As is apparent, the p-type layer 30 is fabricated by known methods in a fashion such that alternating regions of a narrow thickness and a wide thickness above the confinement layer 29 are achieved. From this depiction, it is further apparent that the regions of greater thickness of the layer 30 above the confinement layer 29 is wider in dimension than the regions of narrow thickness. It is additionally apparent that the p-type layers 32, 36 and 38 follow the contours of the layer 30 and thus develop a ribbed contour at the outer layer of the array cell 22. In this manner, the wider, thicker regions represent the elements 16 of FIG. 2 and the narrow, thinner regions represent the interelements 18. Between the first layer 32 of the sandwich structure and the confinement layer 29 within the wider, thicker region is a p-type GaAs region 34. It is this formation of the different p-type layers which develops an effective index of refraction between adjacent areas in the active layer 28 to form the leaky waveguide array concept discussed above.

Light which is generated in the semiconductor laser array cell 22 propagates down the confinement layers 27 and 29 due to the fact that the active layer 28 between them has optical gain. The propagation of light is limited to the regions 40 in the areas of the active layer 28 below the elements due to the differences in indices of refraction created by the waved contour of the layers 30, 32, 36 and 38. In addition, light also propagates in the layer 32 also depicted by regions 40. The layer 32 represents the core of a transverse passive optical waveguide. In the interelement regions light is confined in two waveguides, the active layer 28 and the layer 32, with the majority of the light energy in the layer 32. This creates a higher index of refraction in the interelement regions than in the element regions, thus providing an array of antiguides. It also suppresses oscillation of evanescent wave-type array modes, which are undesirable. See U.S. Pat. No. 4,860,298 entitled "Phase-Locked Array of Semiconductor Lasers Using Closely Spaced Antiguides" issued to D. Botez et al., herein incorporated by reference. In this manner, a substantially single array mode of radiation will be generated in the active layer 28. An array of the type discussed above is described in U.S. Pat. No. 5,063,570, referenced above.

The deposition and photolithographic processes required to fabricate the necessary layers as discussed above limit the minimum dimensions of each element. Furthermore, in order to suppress the high-order modes, and thus, limit the coupling of the radiation between the elements to a fundamental in-phase mode, the overall width of the array cell is also limited. Hence, the number of elements which can be coupled in phase is limited. With the present technology, a single mode semiconductor array cell as described above is limited to approximately 40 array elements having a combined width of approximately 200 microns. Consequently, the output power of these types of semiconductor lasers is limited by the characteristics as discussed. This invention proposes coupling a plurality of array cells of the type discussed above in order to increase the power output of a two-dimensional semiconductor array laser.

Figure 4:
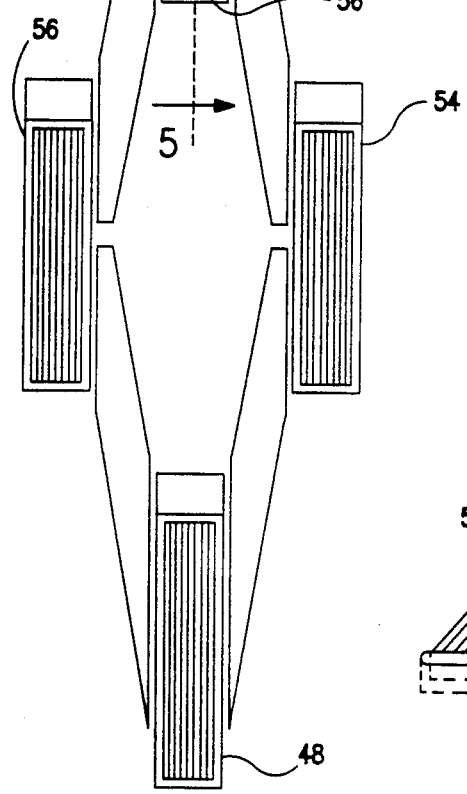
FIG. 4 is an array of coupled semiconductor array cells according to one preferred embodiment of the present invention.

Turning to FIG. 4, a two-dimensional semiconductor laser array 46 is shown in which a plurality of individual semiconductor laser array cells of the type discussed above are positioned relative to each other in a desirable configuration. More particularly, a first semiconductor array cell 48 is substantially aligned along a common axis with a second semiconductor array cell 50. In addition, third and fourth semiconductor array cells 52 and 54 are substantially aligned with each other, and with semiconductor array cells 48 and 50, on opposite sides of the axis defined by the orientation of the first and second semiconductor array cells 48 and 50. All of the array cells are fabricated on a common substrate (not shown) such as substrate 24 above. In this embodiment, therefore, a diamond shaped configuration of four semiconductor array cells 48-54 are coupled in which each semiconductor array cell has an output in phase with each other semiconductor array cell as will be discussed.

Each of the array cells 48-54 includes a predetermined number of elements and interelements, as described above. In addition each of the array cells 48-54 includes a first 90° mirror 56 at one end of the array cell, a second 90° mirror 58 at the other end of the array cell, and a 45° mirror 60 adjacent the second 90° mirror as will be discussed below. Only the mirrors of the array cell 50 are referenced in FIG. 4, however, it will be understood that each of the array cells 48, 52 and 54 includes mirrors of this type and orientation. Each of the mirrors are fabricated within the layers of FIG. 3 by an appropriate method, such as dry etching.

The individual semiconductor array cells 48-54 are coupled in the same fashion in which the different antiguide elements of a single array cell are coupled. More specifically, the radiation which is leaked from the antiguide elements, and is coupled with a consecutive antiguide element in an array cell, is also emitted from each array cell by the outermost elements which are at either side of the array cell. Consequently, radiation is emitted from the sides of each array cell 48-54 at an angle $\theta_1$ relative to the axis defining the elements, as discussed above. Therefore, if a second array cell is positioned in the path of this leaked radiation, the leaked radiation can be coupled to the elements in the second semiconductor array cell, and be in phase with the radiation emitted from the first array cell. Likewise, a third semiconductor array cell positioned in an appropriate location to receive radiation emitted from the second semiconductor array cell can also be coupled to both the first and second semiconductor array cells.

This idea can be realized by again reviewing the semiconductor laser array cell 46 of FIG. 4. In this configuration, radiation leaked from the semiconductor array cell 48, generally along the shaded regions, impinges the semiconductor array cells 52 and 54, as shown. Likewise, radiation leaked from the semiconductor array cells 52 and 54 from their facing sides impinges the semiconductor array cell 50. Each semiconductor array cell 48-54 emits substantially single phase radiation at a predetermined angle substantially perpendicular to the substrate, as will be discussed below.

In order to make sure that the coupled radiation between the different semiconductor array cells is completely in phase, electrodes are deposited on the substrate between the semiconductor array cells. The electrodes are also represented by the shaded regions between the semiconductor array cells 48-54. In FIG. 4, one electrode 64 is depicted by reference, however, it will be understood that there are three other electrodes for the array 46. By this approach, an appropriate potential applied to the electrodes will develop a change in the index of refraction of the active region which will alter the phase of the radiation traveling through this region in order to fine tune the phase to be coupled in the appropriate manner. It will be appreciated that other techniques can also be used to alter the phase.

Figure 5:
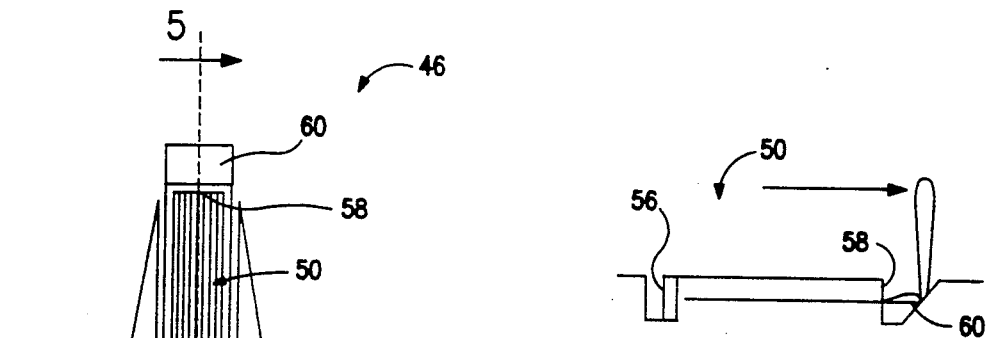
FIG. 5 is a cross-sectional view of one of the semiconductor array cells of FIG. 4 taken along the 5—5 line.

Now turning to FIG. 5, the concept of how radiation is emitted from each individual array cell can be realized. FIG. 5 is a cut-away view along line 5—5 of the semiconductor array cell 50 of FIG. 4. Radiation is first generated by the semiconductor lasing process in the semiconductor array cell 48 by means of applying a potential across the different layers of the semiconductor array cell 48, by a process well known to those skilled in the art. It is also possible to control radiation into the array cell 48 by a master oscillator (not shown), such as a diode laser, in order to control the lasing process, as is also known in the art. Laser radiation will eventually reach the semiconductor array cell 50 by the process as described above.

As radiation is incident at the sides of the semiconductor array cell 50 from the array cell 52 and 54 it will be coupled with the outside elements in that array cell. As the radiation is leaked across the interelements to be coupled with other elements in that array cell it eventually will reach the inner elements. The 90° mirror 56 at a back end of the semiconductor array cell 50 closest to the array cell 48, and the 90° mirror 58 at the front end of the semiconductor array cell 50 enables radiation propagating along the elements to be reflected back and forth to build up intensity by the lasing process. Once the radiation builds up enough intensity it will reach lasing threshold and traverse the mirror 58 and impinge the 45° mirror 60, such that the radiation is emitted in a direction substantially perpendicular to the plane of the substrate, as shown. It is noted, that the angle of the mirror 60 can be at any desirable angle such that the radiation comes off the substrate at the desirable orientation. It is further noted that the mirrors 58 and 60 can be replaced by an appropriate diffraction grating for redirecting the laser beam known to those skilled in the art.

Figure 6:
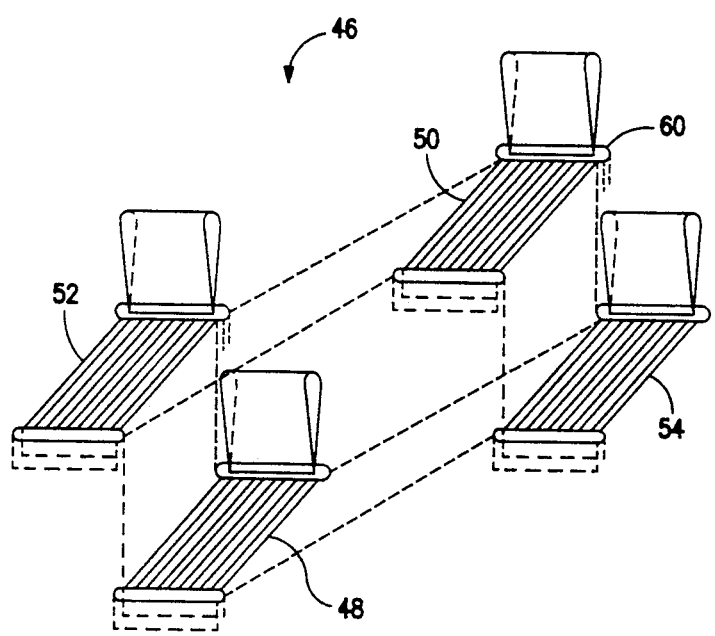
FIG. 6 is a three dimensional schematic of the array of array cells of FIG. 4.

Each of the semiconductor array cells 48-54 includes appropriate mirrors such that radiation is emitted from each array cell at the appropriate orientation. This concept is shown in a 3-dimensional schematic view in FIG. 6. More particularly, FIG. 6 shows the array 46 including each of the individual semiconductor array cells 48-54 in which radiation is being emitted from their front portions.

The semiconductor array 46 depicts a semiconductor laser incorporating a plurality of laser array cells in which there are four individual semiconductor array cells. However, it will be understood by studying FIG. 4 that many other semiconductor array cells can be positioned in the appropriate location to receive leaked radiation from another semiconductor array cell in the same manner. Therefore, FIG. 4 is only a representation of coupling of different array cells together and does not limit the number of array cells which can be coupled.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A semiconductor laser comprising:
   a first array of leaky waveguides positioned on a substrate, said first array of leaky waveguides including an alternating configuration of element regions having a first index of refraction and interelement regions having a second index of refraction, wherein the first index of refraction is less than the second index of refraction, said first array of waveguides operable to generate radiation such that radiation travels along at least one of the element regions, and a portion of the radiation which travels along the at least one element region leaks from the element region into an adjoining interelement region, and wherein the interelement regions separate the element regions at a distance such that the radiation which is emitted into the interelement regions is coupled in-phase with radiation in adjacent element regions; and a second array of leaky waveguides positioned on the substrate, said second array of waveguides including an alternating configuration of element regions having a first index of refraction and interelement regions having a second index of refraction, wherein the first index of refraction is less than the second index of refraction, and wherein radiation emitted from an edge element region of the first array of waveguides is coupled into an edge element region of the second array of waveguides, said first and second arrays emitting radiation of substantially the same wavelength and phase.

2. The semiconductor laser according to claim 1 further comprising third and fourth arrays of leaky waveguides positioned on the substrate, each of said third and fourth arrays of waveguides including an alternating configuration of element regions having a first index of refraction and interelement regions having a second index of refraction, wherein the first index of refraction is less than the second index of refraction, and wherein the first, second, third and fourth arrays of waveguides are configured in a diamond-shape such that radiation leaked from the first array of waveguides impinges the second and third array of waveguides and radiation which leaks from the second and third array of waveguides impinges the fourth array of waveguides.

3. The semiconductor laser according to claim 1 further comprising electrode means for adjusting the phase of the radiation being emitted from the first array to the second array such that the radiation in the second array is substantially in phase with the radiation in the first array, said electrode means positioned between the first and second arrays of waveguides on the substrate and receiving a current to provide the phase adjustment.

4. The semiconductor laser according to claim 1 wherein the first and second arrays include a substantially 90° mirror relative to the substrate positioned at each end of the first and second array such that radiation traveling in the element regions is reflected back and forth along the element regions by the mirrors until the radiation generates enough optical gain to achieve lasing action to be emitted from the arrays.

5. The semiconductor laser according to claim 1 wherein the first and second arrays of waveguides include a substantially 45° mirror at one end of each of the arrays such that laser light emitted from the element regions of each of the arrays impinges the 45° mirror and is emitted at a direction substantially perpendicular to the substrate.

6. The semiconductor laser according to claim 1 wherein the distance between the element regions as defined by the interelement regions in both the first and second arrays is substantially an odd number of one-half lateral wavelengths of the radiation leaking from the element regions.

7. The semiconductor laser according to claim 1 wherein the first and second arrays of waveguides include a diffraction grating at one end of each of the arrays such that laser light emitted from the element regions of each of the arrays impinges the diffraction grating and is emitted at a direction substantially perpendicular to the substrate.

8. The semiconductor laser according to claim 1 wherein the first and second arrays of waveguides include approximately 40 element regions having a combined width of approximately 200 microns.

9. The semiconductor laser according to claim 1 wherein the first and second arrays of waveguides include a plurality of semiconductor layers formed on the substrate, said semiconductor layers including an active layer, a confinement layer and adjacent cladding layers such that light propagates and is confined substantially within the active layer, and wherein at least one of the semiconductor layers is shaped to form the element and interelement regions.

10. The semiconductor laser according to claim 1 further comprising a master oscillator, said master oscillator operable to introduce radiation into the first array of waveguides along the element regions.

11. A method of fabricating a semiconductor laser for generating a laser beam, said method comprising the steps of:

positioning a first array of leaky waveguides on a substrate, said first array of waveguides including an alternating configuration of element regions having a first index of refraction and interelement regions having a second index of refraction, said first index of refraction being less than the second index of refraction, wherein radiation is generated in the element regions and a portion of the radiation which travels along the element regions leaks from the element regions into adjoining interelement regions, and wherein the interelement regions separate the element regions at a distance such that the radiation which is leaked from the element regions is coupled in-phase with radiation in adjacent element regions; and positioning a second array of leaky waveguides on the substrate to receive radiation leaked from the first array of waveguides, said second array of waveguides including an alternating configuration of element regions having a first index of refraction and interelement regions having a second index of refraction, wherein the first index of refraction is less than the second index of refraction, and wherein the first and second arrays emit radiation of substantially the same wavelength and phase configuration.

12. The method according to claim 11 further comprising the steps of positioning third and fourth arrays of leaky waveguides on the substrate such that the third array receives leaked radiation from the first array, and the fourth array receives leaked radiation from the second and third arrays, each of said third and fourth arrays of waveguides also including an alternating configuration of element regions having a first index of refraction and interelement regions having a second index of refraction, wherein the first index of refraction is less than the second index of refraction.

13. The method according to claim 11 further comprising the steps of positioning an electrode on the substrate between the first array and the second array and applying a current to the electrode to adjust the phase of the radiation in the second array to be substantially equal to the phase of the radiation in the first array.

14. The method according to claim 11 wherein the steps of positioning the first and second arrays includes positioning a substantially 90° mirror relative to the substrate at each end of the first and second array such that radiation traveling in the element regions is reflected back and forth along the element regions by the mirrors until the radiation generates enough optical gain to achieve lasing action to be emitted from the arrays.

15. The method according to claim 11 wherein the step of positioning the first and second arrays includes the step of positioning a mirror at one end of each of the arrays such that laser light emitted from each of the arrays is emitted at a direction substantially perpendicular to the substrate.

16. The method according to claim 11 wherein the step of positioning the first and second arrays includes the steps of positioning a diffraction grating at one end of each of the arrays such that laser light emitted from each of the arrays is emitted at a direction substantially perpendicular to the substrate.

17. The method according to claim 11 wherein the step of positioning the first and second arrays includes positioning the distance between the element regions at a dimension of an odd number of one-half lateral wavelengths of the radiation leaking from the element regions.

18. The method according to claim 11 wherein the steps of positioning first and second arrays of waveguides includes positioning first and second arrays of waveguides having approximately 40 elements and having a combined width of approximately 200 microns.

19. The method according to claim 11 wherein the steps of positioning the first array of leaky waveguides and the second array of leaky waveguides includes fabricating a plurality of semiconductor layers formed on the substrate, said semiconductor layers including an active layer, a confinement layer and adjacent cladding layers such that light propagates and is confined substantially within the confinement layers, and wherein at least one of the semiconductor layers is shaped to form the element and interelement regions.

20. The method according to claim 11 further comprising the step of introducing a beam of radiation into the first array of waveguides by a master oscillator.

21. A semiconductor laser comprising:
a first resonant optical waveguide structure including an array of leaky waveguides positioned on a substrate, said first resonant optical waveguide structure operable to generate optical radiation;
a second resonant optical waveguide structure including an array of leaky waveguides positioned on the substrate, said second resonant optical waveguide structure positioned on the substrate to accept radiation leaked from the first resonant optical waveguide structure; and
wherein the first and second resonant optical waveguides structures emit light substantially in phase.

22. The semiconductor laser according to claim 21 wherein each of the first and second resonant optical waveguide structures include a plurality of semiconductor layers, at least one of the semiconductor layers being an active layer positioned between first and second confining layers, wherein the index of refraction of the active layer is higher than the index of refraction of the confining layers such that light is substantially confined within the active layer.

23. The semiconductor laser according to claim 21 wherein each of the first and second resonant optical waveguide structures include an alternating configuration of element regions having a first index of refraction and interelement regions having a second index of refraction, wherein the first index of refraction is less than the second index of refraction, and wherein the interelement regions separate the element regions by an odd number of one-half wavelengths of the center frequency of the radiation from the radiation source means.

24. The semiconductor laser according to claim 21 further comprising third and fourth resonant optical waveguide structures wherein the first, second, third and fourth resonant optical waveguide structures are configured in a diamond-shape such that radiation is leaked from the first waveguide structure and impinges the second and third waveguide structure and radiation is leaked from the second and third waveguide structures and impinges the fourth waveguide structure.

25. The semiconductor laser according to claim 21 further comprising electrode means for adjusting the phase of the radiation beam emitted from the first waveguide structure to the second waveguide structure such that the radiation in the second waveguide structure is substantially equal in phase to the radiation in the first waveguide structure said electrode means positioned between the first and second waveguide structure on the substrate and receiving a current to provide the phase adjustment.

26. The semiconductor laser according to claim 21 wherein the first and second waveguide structures include a substantially 90° mirror positioned relative to the substrate at each end of the first and second waveguide structures such that radiation traveling in the waveguide structures is reflected back and forth by the mirrors until the radiation generates enough optical gain to achieve lasing, transverse one of the mirrors and leave the waveguide structures.

27. The semiconductor laser according to claim 21 wherein the first and second waveguide structures include a reflection means for reflecting the radiation emitted from the waveguide structures substantially perpendicular to the substrate.

* * * * *